United States Patent [19]
Lindinger

[11] Patent Number: 4,870,276
[45] Date of Patent: Sep. 26, 1989

[54] PROCESS FOR VERIFYING THE ENERGY OF AN ION BEAM

[76] Inventor: Werner Lindinger, Gufeltalweg 11, A-6020 Innsbruck, Austria

[21] Appl. No.: 165,994
[22] PCT Filed: Jun. 19, 1987
[86] PCT No.: PCT/AT87/00037
§ 371 Date: Feb. 10, 1988
§ 102(e) Date: Feb. 10, 1988
[87] PCT Pub. No.: WO87/07978
PCT Pub. Date: Dec. 30, 1987

[30] Foreign Application Priority Data
Jun. 20, 1986 [AT] Austria .................. 1680/86

[51] Int. Cl.$^4$ .................................. B01D 59/44
[52] U.S. Cl. .................... 250/282; 250/288; 250/252.1
[58] Field of Search ............ 250/281, 282, 283, 288, 250/423 R, 252.1 R

[56] References Cited
PUBLICATIONS

"A New Tandem Mass Spectrometer for Study of Ion–Molecule Reactions" Smith et al. *Int. Journ. of Mass–Spectrometry and Ion Physics*, vol. 14, No. 2, 1974, pp. 171–181.

"An Improved Tandem Mass Spectrometer–Ion–Cyclotron–Resonance Spectrometer", Kemper et al., *Int. Journ. of Mass–Spectrometry and Ion Physics*, vol. 52, No. 1, 1983, pp. 1–24.

*Primary Examiner*—Bruce C. Anderson
*Attorney, Agent, or Firm*—Lorusso & Loud

[57] ABSTRACT

Process for adjusting the precise energy of an ion beam, generally less than 2 eV, emitted by an ion source into a reaction chamber, and causing ion/molecule reactions therein. The reaction chamber is filled with a calibration gas and the voltage which accelerates the ions between the ion source and reaction chamber is varied until the energy-dependent ratio between the rates of production of the two reaction products attains a preset value or until the energy-dependent production rate of a reaction product, the energy-dependence of said production rate showing an extreme value, reaches said extreme value.

2 Claims, 2 Drawing Sheets

KINETIC ENERGY $KE_{cm}$ IN ev (CENTER OF GRAVITY SYSTEM)

PROCESS FOR VERIFYING THE ENERGY OF AN ION BEAM

BACKGROUND OF THE INVENTION

The invention relates to a process for verifying and adjusting the precise value of the energy, generally being less than 2 eV, of the ions emitted by an ion source and entering a reaction chamber as a beam, which cause ion molecule reactions in the reaction chamber, the reaction products of which being detectable mass spectroscopically.

On studying ion molecule reactions, ions (e.g. $Kr^+$, $He^+$) of defined energy are directed to neutral molecules. The interaction of ions and molecules can then consist in a mere charge exchange. But it is also possible that it comes to a chemical change of the hit molecule, e.g. by dissociation. Mass and charge of the reaction products can be analysed in a mass spectrometer. This is done today primarily to determine the cross sections of different ion molecule reactions at different energies.

The application of the process described in the analysis of the composition of the gas bombarded with ions, especially to the measurement of air pollutants, is only possible under very certain conditions. To be able to test the exhaust gases of combustion processes for CO, NO and $NO_2$ with a single ion beam, the use of an ion source is important, that emits ions with an energy of less than 2 eV, which on the one hand ionize the relevant contaminations, but on the other hand do not dissociate the components of the gas composition. It has to be taken care that the ion molecule reaction takes place in the vacuum under single collision conditions. Hence, the generated product ions should, in their turn, not produce further products in a manner difficult to control.

Also in those cases, where the ion molecule reactions of the kind described are only used to measure air pollutants and details of the reaction are furthermore not interesting, it is nevertheless necessary, to hold the energy of the ions impinging on the gas to be tested at a predetermined value, as the production rate of the product ions is differently energy dependent. A direct measurement of the voltage between the emission filament of the ion source and the reaction chamber can therefore only be used for a coarse adjusting of the ion energy, as already small changes of the surface coatings (as they occur especially in the presence of different gas contaminations) in the aperture systems in the ion source or also in the reaction chamber lead to changes of the contact potentials in the order of 0.1 Volts, whereby the energy of the ions is changed by just the same amount of 0.1 eV.

The process often used with scientific investigations of molecule reactions to unify the energy of the ions used for the investigation, where they are led through a buffer gas, is not possible here, where an ion beam should cause reactions in a considerably evacuated reaction chamber. The application of electrical and magnetical fields already proposed for such cases to mask out a part of the ion beam depending on its energy is too expensive for the commercial use of ion molecule reactions.

The invention is based on the fundamental idea to use just the energy dependence of ion molecule reactions, which is the reason why the stabilisation of the ion energy is regarded as being so important, for the stabilisation. To put this idea into practice quantities had to be found that indeed depend on the energy of the injected ions but not on the absolute value of the product ion current. This absolute value namely depends on different quantities, e.g., on the geometry of the arrangement, on the intensity of the ion current, on the concentration of the gas to be analysed etc., and therefore does not allow simple conclusions on the ion energy.

SUMMARY OF THE INVENTION

The solution of the problem put forward according to the invention provides, that a calibration gas is filled into the reaction chamber and that the voltage which accelerates the ions between the ion source and the reaction chamber is varied until the energy-dependent ratio between the production rates of two reaction products attains a pre-set value or until the production rate of a reaction product, the energy-dependence of said production rate showing an extreme value, reaches said extreme value.

The two possible realizations of the inventive idea, namely the measurement of an energy-dependent ratio of product rates or the searching for the extreme value of a production rate, are described in the following by an example especially important in practice, where the ion source emits $Kr^+$-ions and air is used as calibration gas.

DESCRIPTION OF THE PREFERRED EMBODIMENTS

Figure 1:
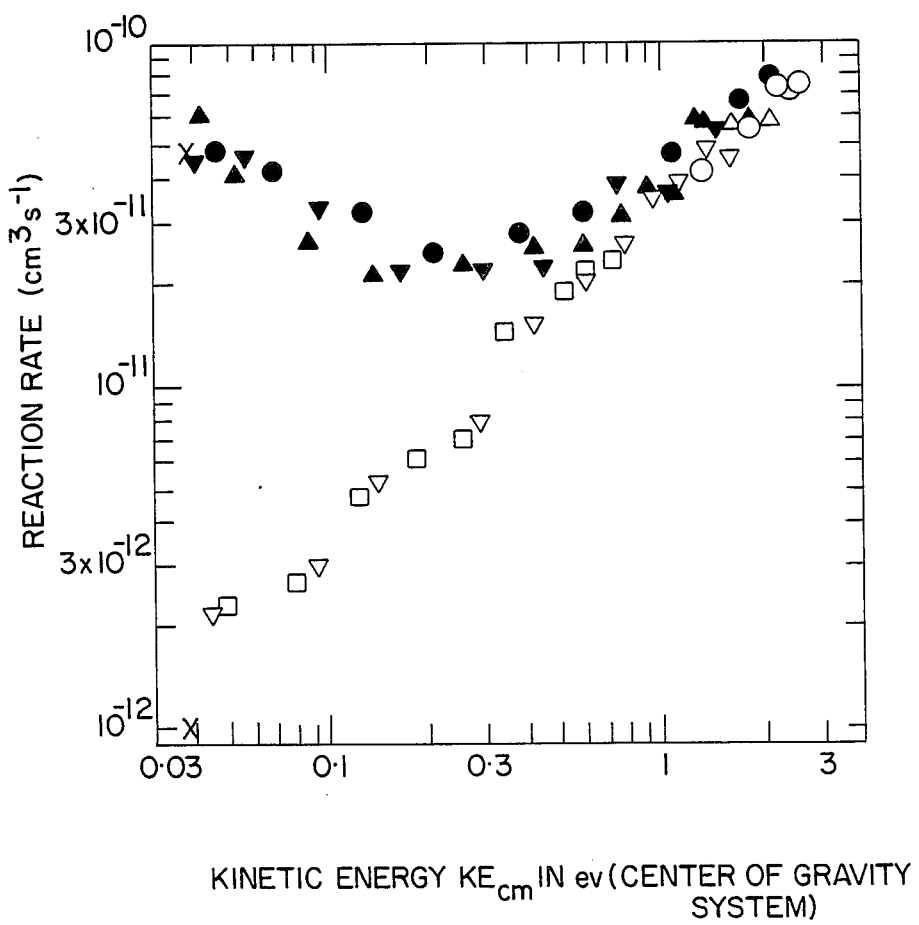
FIG. 1 shows the reaction rate for krypton and oxygen ions versus kinetic energy of the ions.
Figure 2:
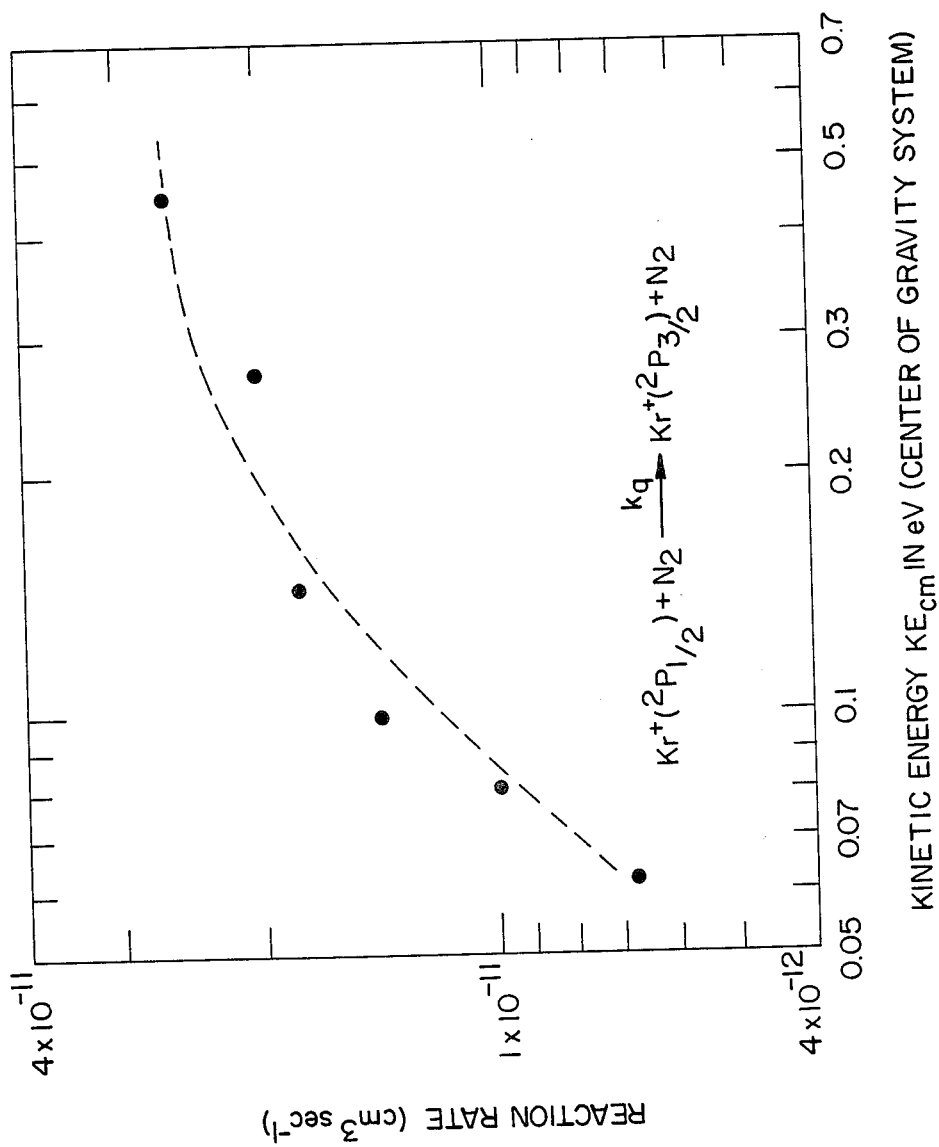
FIG. 2 shows the reaction rate of krypton ions with nitrogen versus kinetic energy of the ions.

The description is carried out by diagrams, where FIG. 1 shows the reaction rate for $Kr^+$ and $O_2^+$ according to T. T. C. Jones, Thesis Univ. Aberystrwyth 1982, and FIG. 2 the reaction rate for the transition of the Krypton-ions between different spin states as a result of collisions with $N_2$.

The detailed description of the device for carrying out the method can remain undone, as it is already known per se. A schematic description of an applicable arrangement together with literature references that explain particular details can be found in an article by H. Villinger, J. H. Futrell, A. Saxer, R. Richter and W. Lindinger in J. Chem. Phys. 80(6), Mar. 15, 1984. The used low energy Krypton-ions can be produced by an ion source which is based on the principle of electron impact. Such ion sources are sold, e.g. by the firm Balzers with the reference number BG 528370 T. An octopole-system connected to the ion source produces a high frequency field, that prevents the ion beam from diverging. Subsequently the ions enter the reaction chamber, into which the gas to be analysed is introduced. A quadrupole mass-spectrometer, that only allows ions of a certain mass to pass on to a standard electronic ion detection system, serves for the analysation of the beam coming from the reaction chamber. The density of the gas to be analysed in the reaction region is typically in the order of $10^{-2}$ Torr, whereas the free path of the gas in the region of ion source and of the mass spectrometer should be larger than the dimensions of the device, i.e. a vacuum of e.g. $10^{-5}$ Torr is maintained.

To hold the energy of the Krypton-ions at a low reproduceable adjustable value between 0.2 and 0.5 eV normal, non-polluted atmospheric air is filled into the reaction chamber from time to time and the production rates for $O_2+$ and $CO_2+$ are measured. The air used as calibration gas contains 78.084 vol.-% $N_2$
  20.946 vol.-% $O_2$
  0.934 volums-% Argon
  0.033 volums-% $CO_2$ and $H_2O$ and traces of other gases that can be neglected in this context.

While $Kr^+$ does not react wth $N_2$ or Ar at low energy collisions ($KE_{cm} < 1.5$ eV), it undergoes charge exchange processes both with $O_2$ and $CO_2$, where the reaction rates in the case of $O_2$ are dependent both on the kinetic energy of the collision partners and on the spin state of the $Kr^+$ ions. This dependence is shown in FIG. 1 where the measured values in black refer to the spin state 3/2 and the data shown in white refer to the spin state $\frac{1}{2}$. For $CO_2$ k=$6.3 \times 10^{-10}$ cm$^3$ sec$^{-1}$, independent of KE cm and the spin state of the $Kr^+$-ions. In the ion beam coming from the ion source $Kr^+(^2P_{\frac{1}{2}})$ and $Kr^+(^2P_{3/2})$ are present in the statistical ratio of 1:2 and this ratio does not change in the reaction chamber, although per reactive collision of a $Kr^+$-ion several collisions with $N_2$ occur. The quench rate, $k_q$ for the conversion of the energetically higher $Kr^+(^2P_{\frac{1}{2}})$ into $Kr^+(^2P_{3/2})$, $$Kr^+(^2P_{\frac{1}{2}}) + N_2 \xrightarrow{k_q} Kr^+(^2P_{3/2}) + N_2$$

is small enough (cf. FIG. 2), so that the ratio $Kr^+(^2P_{\frac{1}{2}}):Kr(^2P_{3/2})$ in spite of the dominance of $N_2$ in the calibration gas is not changed essentially. Thus a ratio of the product ion currents $i(O_2+):i(CO_2+)$ results as $$\frac{i(O_2^+)}{i(CO_2^+)} = $$

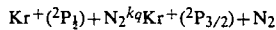

$$\frac{(^kKr_{3/2} - O_2 \cdot [Kr^+(^2P_{3/2})] + {^kKr_{1/2}} - O_2 \cdot [(Kr^+(^2P_{1/2})]) \cdot [O_2]}{^kKr^+_{1/2,3/2} - CO_2([Kr^+(^2P_{3/2})] + [Kr^+(^2P_{1/2})]) \cdot [CO_2]}$$

As the production rate of $i(CO_2+)$ is constant as mentioned above, the ratio of the product ion currents $i(O_2+)/i(CO_2+)$ changes according to FIG. 1, the left) branch of the values shown in white being negligible in practice. This dependence can be used to detect the energy of the Krypton-ions by measuring the product ion ratio at clean dry air, whereupon the extraction voltage or the aperture voltge of the ion source is varied until the desired value is attained.

If one confines oneself to work at a fixed value of the ion energy of 0.3 eV it is sufficient to measure only the product ion current $i(O_2+)$ and to vary the voltage until said current reaches its minimum.

The invention is not restricted to the embodiment shown. For example it would be possible, when nitrogen is used as calibrations gas, to utilize in a similar manner the ratio of $N_2+$, which is produced mainly at a lower energy, and $N+$, which is produced mainly at a higher energy.

I claim:

1. A process for precisely adjusting the energy of krypton ions comprising:
    filling a reaction chamber with a calibration gas containing oxygen and carbon dioxide;
    emitting krypton ions from an ion source;
    accelerating the krypton ions by applying a voltage between the ion source and the reaction chamber;
    directing the krypton ions into the calibration gas thereby causing the ion molecule reactions with the oxygen and carbon dioxide;
    measuring the ratio of oxygen ions and carbon dioxide ions by mass spectrometry.
    adjusting the voltage used to accelerate the krypton ions until the ratio of oxygen ions and carbon dioxide ions attains a preset value.

2. The process according to claim 1, wherein the calibration gas is air.

* * * * *